United States Patent [19]
Ohtaka

[11] Patent Number: 4,705,950
[45] Date of Patent: Nov. 10, 1987

[54] SPECIMEN-EXCHANGING APPARATUS
[75] Inventor: Tadashi Ohtaka, Katsuta, Japan
[73] Assignee: Hitachi, Ltd., Tokyo, Japan
[21] Appl. No.: 826,662
[22] Filed: Feb. 6, 1986
[30] Foreign Application Priority Data Feb. 6, 1985 [JP] Japan ................................ 60-21321

[51] Int. Cl.4 ............................................. G21K 5/08
[52] U.S. Cl. ..................... 250/441.1; 250/442.1; 414/217
[58] Field of Search .............. 250/441.1, 440.1, 442.1; 414/217; 118/728, 729, 733, 500

[56] References Cited
U.S. PATENT DOCUMENTS

| 2,264,209 | 11/1941 | Krause | 250/441.1 |
| 4,047,624 | 9/1977 | Dorenbos | 118/729 |
| 4,278,380 | 7/1981 | Guarino | 414/217 |
| 4,467,210 | 8/1984 | Sugihara et al. | 250/492.2 |
| 4,503,807 | 3/1985 | Nakeyama et al. | 118/719 |
| 4,542,712 | 8/1985 | Sato et al. | 118/726 |
| 4,604,020 | 8/1986 | Toro Lira et al. | 414/217 |

Primary Examiner—Carolyn E. Fields
Assistant Examiner—Paul A. Guss
Attorney, Agent, or Firm—Antonelli, Terry & Wands

[57] ABSTRACT

A feed screw is provided in a specimen-exchanging chamber connecting with a specimen chamber valve and a removable element is removed in the axial direction of the feed screw by rotation of the feed screw. The removal of the removable element makes it possible to remove a specimen holder between the specimen chamber and the specimen-exchanging chamber. It is possible to load and unload the specimen holder with the removable element. Thus, while leaving the specimen holder in the specimen chamber, only the removable element can be removed to the specimen-exchanging chamber.

4 Claims, 4 Drawing Figures

SPECIMEN-EXCHANGING APPARATUS

BACKGROUND OF THE INVENTION

The present invention relates to a specimen-exchanging apparatus and, more particularly, to a specimen-exchanging apparatus for apparatuses requiring vacuum such as, for example, a scanning electron microscope, an electron beam lithography apparatus and the like.

In a scanning electron microscope, an electron beam lithography apparatus, an ion beam lithography device, a dry etching device, a sputtering device and the like, the required treatment is carried out in relation to a specimen in a specimen chamber situated under a vacuum state.

However, conventional specimen-exchanging apparatuses of these kinds of devices are arranged to exchange a specimen by threading a specimen-exchanging bar into a threaded receiver and, under this state, advancing and retreating the specimen-exchanging bar.

Accordingly, it is required to rotatably move the specimen-exchanging bar into a specimen holder and linear movement of advancing and retreating the specimen holder between a specimen-exchanging chamber and a specimen chamber. As a result, a problem arises in that dust is created by virtue of the movements, with the dust becoming attached on a specimen surface. Further, another problem resides in the fact that it is impossible to carry out dry vacuumizing, since it is necessary to employ an O-ring and grease oil for a vacuum sealing member to enable advancing and retreating of the specimen-exchanging bar.

It is an object of the present invention to provide a specimen-exchanging apparatus which is suitable for preventing a creation of dust during operation of the apparatus.

It is another object of the present invention to provide a specimen-exchanging apparatus which is suitable for dry vacuumizing.

According to the present invention, there is provided a specimen-exchanging apparatus comprising a vacuumized specimen chamber, a specimen-exchanging chamber connected to said specimen chamber with the specimen-exchanging chamber being constructed so as to be, openable to ambient, valve means for screening the connection between the specimen chamber and the specimen exchanging chamber and releasing the screening, exhausting means for carrying out the exhaust of said specimen-exchanging chamber, means for linearly removing a specimen holder for retaining a specimen between said specimen-exchanging chamber and said specimen chamber and means provided in said removing means and for loading and unloading said specimen holder to said removing means.

The above-stated objects and features and further objects and features of the present invention will be appparent from the following description with reference to the drawings.

DETAILED DESCRIPTION

Figure 3:
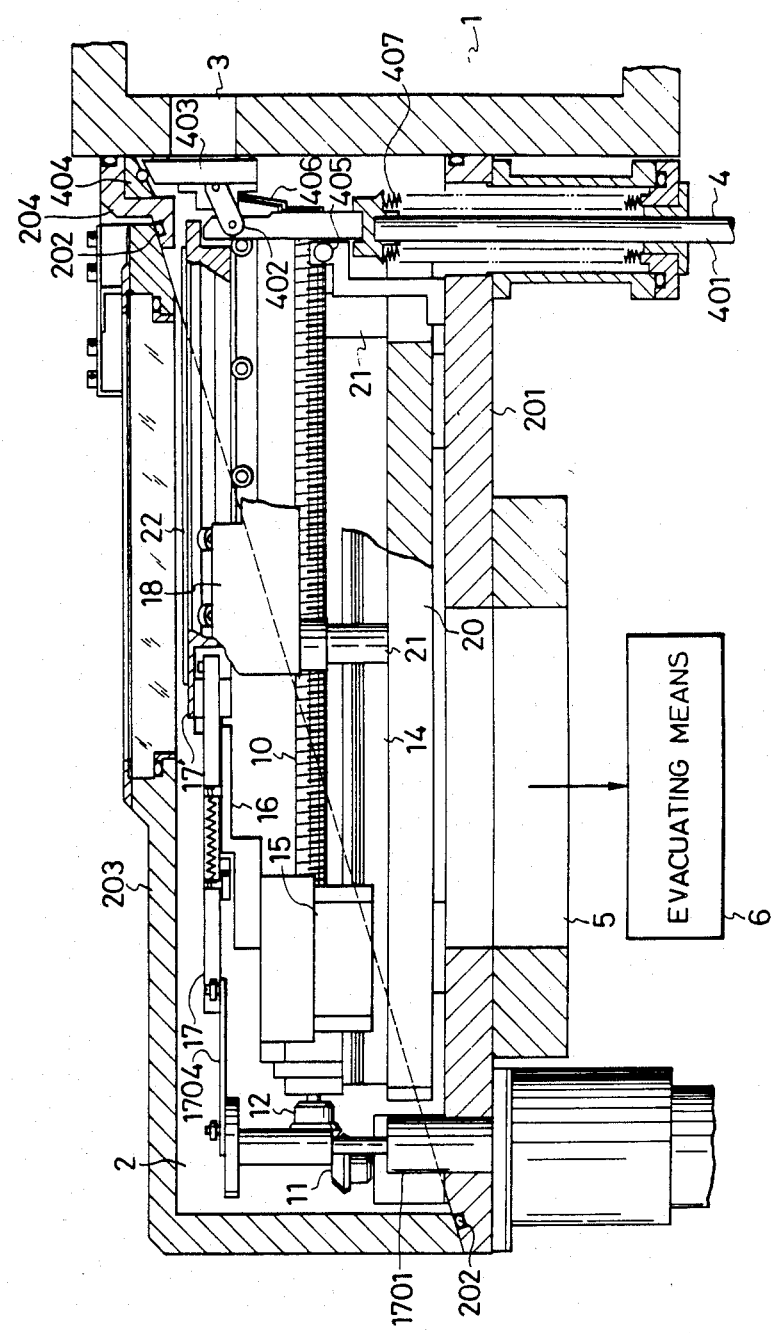
FIG. 3 is a sectional view of the apparatus a lower side of FIG. 1.

With reference to the drawings, a vacuumized specimen chamber 1 and a specimen-exchanging chamber 2 are connected with each other by way of a specimen-removing aperture 3. A valve mechanism 4 is designed to open and close a specimen-removing aperture 3 so as to accomplish the connection or the disconnection between the specimen chamber 1 and the specimen-exchanging chamber 2. In the valve mechanism, when the thrusting operation of an operation shaft 401, caused by a driving device (not shown) is carried out outside the specimen-exchanging chamber 2, a valve body 403, connected to the tip of the operation shaft 401 by a connector 402, is thrust at a stopper 404. As a result, the valve body 403 closely fits on a valve seat surface on the side of the specimen-exchanging chamber 2 situated around the specimen-removing aperture 3 so as to close the specimen-removing aperture 403. Here, a stopper 405 serves to prevent more removal of the operation shaft 401 o the left side in FIG. 3 than it is really needed.

On the contrary, when the operation shaft 401 is pulled by the driving device (not shown), the valve body 403 is removed to the location at a distance from the specimen-removing aperture 3 so as to open the aperture. A plate spring 406 has a function of always acting in direction of urging the valve body 403 away from the valve seat surface. Accordingly, when the valve body 403 is removed so as to open the specimen-removing aperture 3, substantially at the same time with the removal, the valve body 403 is displaced from the valve seat surface and thus the removal of the valve body 403 is smoothly carried out.

Further, in case of carrying out the operation of pushing or pulling the operation shaft 401, it is possible to prevent the connection between the specimen-exchanging chamber 2 and an outside thereof bellows 407.

The specimen-exchanging chamber 2 is composed of a base part 201 and a lid 203 coupled to be loaded and unloaded with the base part through a vacuum rail 202. The lid 203 is coupled to the base part 201 by a member 204 by a hinge (not shown). Thus, the loading and unloading of the lid 203 with the base part 201 is carried out by a rotational movement of the lid 203 at the center of hinge.

Inside the specimen-exchanging chamber 2, the exhaust is accomplished through an exhaust aperture 5 by an exhaust device. As long as the exhaust inside the specimen-exchanging chamber 2 is carried out and a predetermined vacuum degree is maintained, the vacuum of the specimen chamber 1 is maintained even if the specimen-removing aperture 3 is opened. When the lid 203 is opened, the inside of the specimen-exchanging chamber 2 is to the ambient air. Then, there is no need of accomplishing the exhaust inside the specimen-exchanging chamber 2 and thus, the exhausting inside the specimen-exchanging chamber by the exhaust device 6 is topped and the specimen-removing aperture 3 is closed by the valve mechanism 4. Consequently, even if the inside of the specimen-exchanging chamber 2 is exposed to the ambient air, there the vacuum inside the specimen chamber 1 is maintained.

Now, it is presumed that the specimen-removing aperture is opened and that the inside of the specimen-exchanging chamber 2 is maintained at a predetermined vacuum degree.

Figure 1:
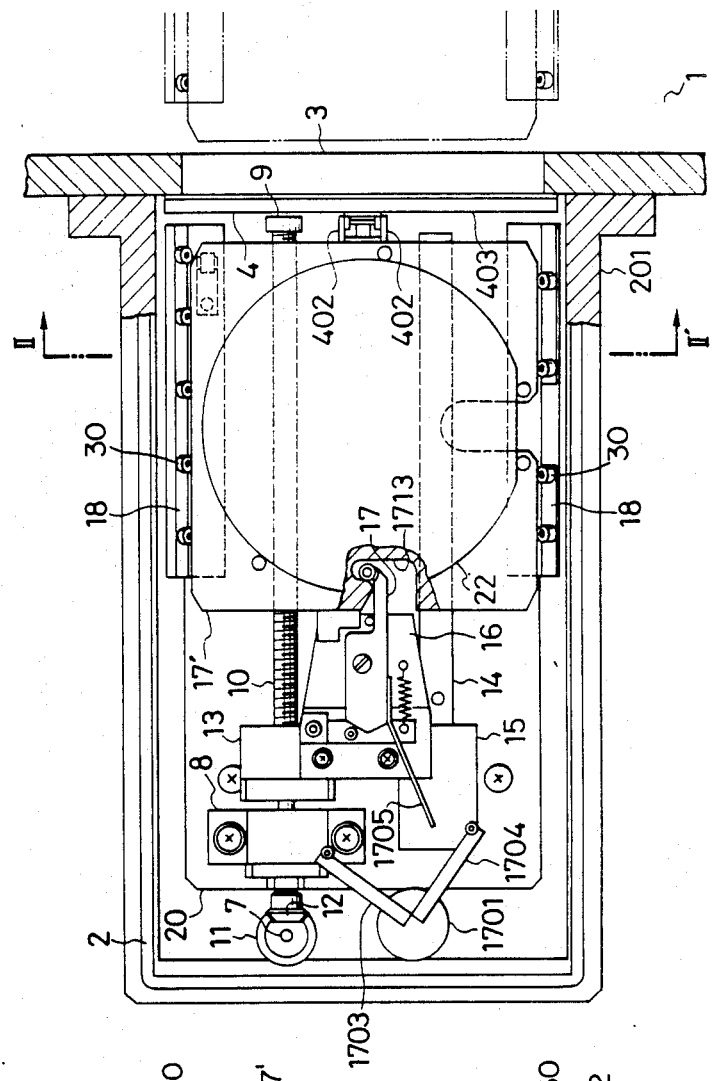
FIG. 1 is a partially sectional plan view of a specimen-exchanging apparatus under the state of removing a lid according to one embodiment of the present invention.
Figure 2:
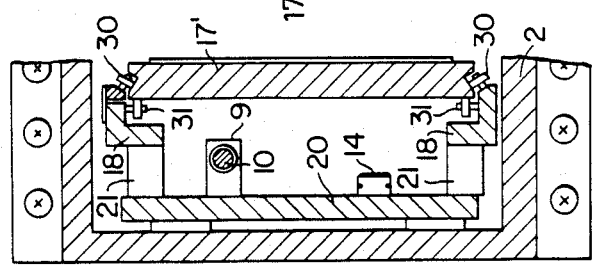
FIG. 2 is a sectional view taken along the line II—II' in FIG. 1.

Under the above-described condition, when a rotatable shaft 7, extending through the wall of the specimen-exchanging chamber 2 from the outside to the inside of the chamber in a manner of keeping vacuum of the chamber is rotated by a motor (not shown) connected at the outside of the specimen-exchanging chamber 2, the rotation is transmitted to a feed screw 10 supported by bearings 8 and 9 by way of bevel gears 11, 12 provided in the rotatable shaft 7 and the feed screw 10 and engaging with each other. Thus, a nut 13 threaded through the feed screw 8 is removed to the right side in FIGS. 1 and 3.

A guide 14 is disposed in parallel with the feed screw 10 and a slider 15 is slidably connected to the guide 14. In order to smoothly remove the slider 15, a plurality of balls (not shown) are interposed between the guide 14 and the slider 15.

A removable element 16 is fixed so as to bridge the nut 13 and the slider 15. Accordingly, the removal of the nut 13 to the right serves to remove the removable element 16 to the right without rotating the element 16. With the removal of the removable nut 16 to the right, the specimen holder 17', coupled to be loaded and unloaded with the removable element 16 through a specimen-chucking mechanism 17 provided in the removable element 16, is guided by a pair of guides 18 and thus is passed through the specimen-removing aperture 3 and is transferred to a pair of guides 19 disposed in the specimen chamber 1. Either end of the specimen holder 17' is shaped into a V-like shape. The specimen holder 17' is guided by a pair of guides 18 in the form of stretching V-forms at both ends between lower side rollers 30 and upper side rollers 31. This design is arranged so as to enable a smooth removal of the specimen holder 17'. Thus, when the specimen holder 17' is removed to the specimen chamber 1, a wafer 22 forming a specimen is retained on the specimen holder 17' by means of a well-known method. Accordingly, with the removal of the specimen holder 17' to the specimen chamber 1, the wafer 22 forming the specimen is similarly removed to the specimen chamber 1. Thus, inside the specimen chamber 1, it is possible to carry out a desired treatment of the specimen. Concretely, this treatment means, for example, in case of a scanning electron microscope, two-dimensional scanning using an electron beam required for observation of the image of specimen and, in case of an electron-beam drawing device, patterning of a specimen by using an electron beam.

Figure 4:
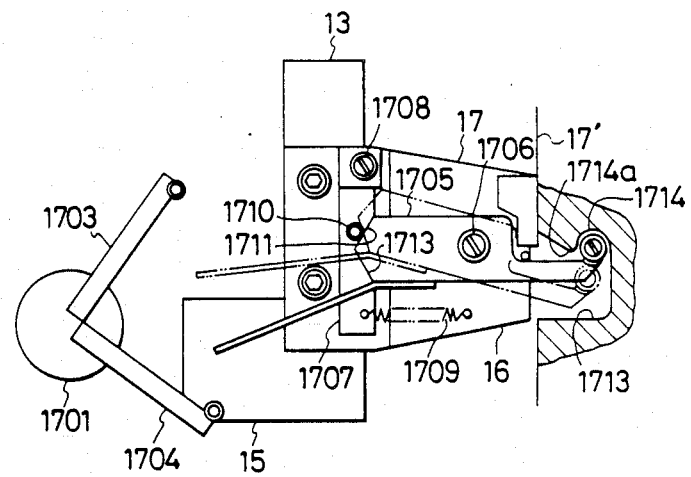
FIG. 4 is a partially sectional plan view showing a specimen-chucking mechanism.

The specimen-chucking mechanism 17 as shown in FIG. 4 includes a switching shaft 1701 extending through the wall of the specimen-exchanging chamber 2 from the outside to the inside of the chamber in a manner enabling a maintaining of vacuum therein. The driving device (not shown), connected to the outer end thereof, serves to selectively switch a chuck arm 1703 and an unchuck arm 1704 provided in the inside end thereof to a chuck position and an unchuck one. When the chuck arm 1703 is switched to the chuck position, the chuck arm 1703 serves to rotate a lever 1705 counterclockwise with a center as a supporting shaft 1706 supporting the lever on the removable element 16 and to be located as shown by a solid line. Namely, the lever 1705 is stopped at the location where a stopper 1710 always biased counterclockwise by a spring 1709 with a center as a supporting shaft 1708 provided in a lever 1707 and releasably supporting the lever 1707 to the removable element 16 is made to be thrust on a stopper surface 1711.

On the other hand, when the unchuck arm 1704 is switched to the unchuck position, the lever 1705 serves to rotate in a clockwise direction by an unchuck arm 1704 and stops at the location where the stopper 1710 is thrust on the stopper surface 1713.

The sample holder 17' provides a concave portion 1713, a part of which is designed to be an engaging part 1714 to be engaged with a L-form tip portion of the lever 1705.

In the process where the specimen 22 is removed from the specimen-exchanging chamber 2 to the specimen chamber 1, the unchuck arm 1704 stays at the unchuck position and thus, the stopper 1710 is in contact with the stopper surface 1713 and the L-form tip portion of the lever 1705 enters into the concave portion 1713, but is not engaged with the engaging part 1714. Upon completion of removal of the specimen 22 to the specimen chamber 1, the feed screw 10 is reversely rotated under the state where the specimen 22 and the specimen holder 17' are left in the specimen chamber 1. By the reverse rotation, the removable element 16 is removed to the specimen-exchanging chamber 2. Afterwards, the specimen-removing aperture 3 is closed by the valve mechanism 4.

The predetermined treatment is carried out with respect to the specimen 22 remaining in the specimen chamber 1. After the treatment specimen 22 with a new specimen with the exchange being carried out in the following manner.

The chuck arm 1703 is switched to the chuck position. By this switching, the stopper 1710 contacts the stopper surface 1711. Next, the specimen-removing aperture 3 is opened and the removable element 16 is removed to the specimen chamber 1. When the L-form tip portion of the lever 1705 passes through a projecting part 1714a just before the engaging part 1714, this projecting part serves to rotate the L-form tip portion slightly in a clockwise direction, with a center, the supporting shaft 1706 as opposing a tractive force of the spring 1709. Then, the L-form tip portion passes through the projecting portion 1714a, when it is automatically engaged with the engaging part 1714 by the tractive force of the spring 1709. Afterwards, the feed screw 10 is rotated in a reverse direction. By this reverse rotation, the specimen holder 17' where the removable element 16, therefore, the treated specimen 22 is retained, is removed to the specimen-exchanging chamber 21. After that, the valve mechanism 4 serves to close the specimen-removing aperture 3 and then to release the engagement of the L-form tip portion of the lever 1705 with the engaging part 1714. Accordingly, under this state, when the lid 203 is opened and the specimen-exchanging chamber 2 is opened to the ambient air, it is possible to exchange the treated specimen 22 with a new specimen.

After exchanging a specimen, the lid 203 is closed and the exhausting is carried out so as to bring the specimen-exchanging chamber 2 to a predetermined degree of vacuum.

After that, in order to remove an exchanged new specimen to the specimen chamber 1, the same operation as described above should be carried out.

A base plate 20 is provided on the bottom of the specimen-exchanging chamber 2 with the bearings 8, 9 and the guide 14 being fixed on the base plate 20. A support means for supporting a pair of guides 18 is also fixed on the base plate 10.

According to the embodiment described above, there are no chances of a breaking down of the vacuum of the specimen-exchanging chamber 1 when exchanging a specimen. Further, the removal of a specimen between the specimen chamber 1 and the specimen-exchanging chamber 2 is automatically carried out by a linear movement of the chucking mechanism 17. Accordingly, conditions of raising or creating do not arise and thus, a dry vacuumizing is possible. Further, it is possible to automatically accomplish drive the feed screw 10, switching of positions of the lever 1705 and drive of the valve mechanism 4 from the outside of the specimen-exchanging chamber 2. Thus, the automatic switching of a specimen can be easily realized.

It is also possible to delete the bevel gears 11 and 12 and the rotation shaft 7 and to project the feed screw 10 from the inside of the specimen-exchanging chamber 2 to the outside thereof in a vacuum sealed manner and to directly connect the feed screw 10 with a motor (not shown).

In the embodiment described above, it is possible for the persons in the art to which the present invention pertains to accomplish some transformations or conversions without departing from the principle of the present invention and I therefore do not wish to be limited to the details shown and described hereinabove, but intend to cover all modifications as are encompassed by the scope of the appended claims.

I claim:

1. A specimen-exchanging apparatus comprising a specimen chamber subjected to a vacuum, a specimen-exchanging chamber connected with said specimen chamber, said specimen-exchanging chamber being openable to ambient air, valve means for sealing and releasing the connection between said specimen chamber and said specimen-exchanging chamber means for exhausting said specimen-exchanging chamber, rotating means for rotating a feed screw means in clockwise and counterclockwise directions, said feed screw means extending within said specimen-exchanging chamber along the longitudinal coaxial direction of both said specimen-exchanging chamber and said specimen chamber, guide means disposed in parallel with said feed screw means, a removable nut means threaded through said feed screw means for moving slidably in a direction from said specimen-exchanging chamber to said specimen chamber and in an opposite direction from said specimen chamber to said specimen-exchanging chamber by a rotataional direction of said feed screw means, said nut means being formed monolithically with a moving means for removing a specimen holder mounted on said guide means and retaining a specimen for movement linearly between said specimen-exchanging chamber and said specimen chamber, and said moving means being provided with a specimen-chucking means for loading and unloading said specimen holder from said nut means.

2. A specimen-exchanging apparatus according to claim 1, wherein said specimen-chucking means includes a lever means for accomplishing a loading and unloading of said specimen holder by switching position thereof.

3. A specimen-exchanging apparatus according to claim 2, further comprising a rotatable shaft means extending through a wall of said specimen-exhanging chamber for rotating said rotating means from the outside to the inside of the specimen-exchanging chamber in a manner so as to maintain a vacuum in the specimen-exchanging chamber.

4. The specimen-exchanging apparatus according to claim 2 further including means for rotating said lever means disposed outside said specimen-exchanging chamber.

* * * * *